US010262873B2

(12) United States Patent
Timans

(10) Patent No.: US 10,262,873 B2
(45) Date of Patent: Apr. 16, 2019

(54) PRE-HEAT PROCESSES FOR MILLISECOND ANNEAL SYSTEM

(71) Applicant: Mattson Technology, Inc., Fremont, CA (US)

(72) Inventor: Paul Timans, Cambridge (GB)

(73) Assignee: Mattson Technology, Inc., Fremont, CA (US)

( * ) Notice: Subject to any disclaimer, the term of this patent is extended or adjusted under 35 U.S.C. 154(b) by 5 days.

(21) Appl. No.: 15/417,470

(22) Filed: Jan. 27, 2017

(65) Prior Publication Data
US 2017/0221722 A1   Aug. 3, 2017

Related U.S. Application Data

(60) Provisional application No. 62/289,519, filed on Feb. 1, 2016.

(51) Int. Cl.
*H01L 21/324* (2006.01)
*H01L 21/67* (2006.01)

(52) U.S. Cl.
CPC ........ *H01L 21/324* (2013.01); *H01L 21/6719* (2013.01); *H01L 21/67115* (2013.01); *H01L 21/67248* (2013.01)

(58) Field of Classification Search
CPC .......... H01L 21/6719; H01L 21/67115; H01L 21/324; H01L 21/67248; H01L 21/02672; H01L 21/02255; H01L 21/02263; H01L 21/02299; H01L 21/0231; H01L 21/02312; H01L 21/02329
See application file for complete search history.

(56) References Cited

U.S. PATENT DOCUMENTS

| | | |
|---|---|---|
| 6,204,203 B1 | 3/2001 | Narwankar et al. |
| 7,442,415 B2 | 10/2008 | Conley, Jr. et al. |
| 7,790,633 B1 | 9/2010 | Tarafdar et al. |
| 8,323,754 B2 | 12/2012 | Olsen et al. |
| 8,809,175 B2 | 8/2014 | Tsai et al. |
| 9,093,468 B2 | 7/2015 | Tsai et al. |
| 2003/0013280 A1* | 1/2003 | Yamanaka .............. C23C 16/24 438/487 |
| 2004/0058560 A1 | 3/2004 | Ranish et al. |
| 2009/0175605 A1 | 7/2009 | Kobayashi |
| 2010/0279516 A1 | 11/2010 | Chen et al. |
| 2014/0034632 A1 | 2/2014 | Pan et al. |

(Continued)

OTHER PUBLICATIONS

Ragnarsson et al., "The Importance of Moisture Control for EOT Scaling of Hf-Based Dielectrics," *Journal of the Electrochemical Society*, vol. 156, Issue 6, Apr. 3, 2009, pp. H416-H423.

(Continued)

*Primary Examiner* — Thanh Y Tran
(74) *Attorney, Agent, or Firm* — Dority & Manning, P.A.

(57) ABSTRACT

Preheat processes for a millisecond anneal system are provided. In one example implementation, a heat treatment process can include receiving a substrate on a wafer support in a processing chamber of a millisecond anneal system; heating the substrate to an intermediate temperature; and heating the substrate using a millisecond heating flash. Prior to heating the substrate to the intermediate temperature, the process can include heating the substrate to a pre-bake temperature for a soak period.

14 Claims, 12 Drawing Sheets

(56) References Cited

U.S. PATENT DOCUMENTS

| | | | |
|---|---|---|---|
| 2014/0235072 A1* | 8/2014 | Ito | H01L 21/67115 |
| | | | 438/795 |
| 2014/0335685 A1 | 11/2014 | Hsiung et al. | |
| 2015/0140838 A1 | 5/2015 | Kashefi et al. | |
| 2015/0311080 A1* | 10/2015 | Yokouchi | H01L 21/324 |
| | | | 438/795 |

OTHER PUBLICATIONS

Ferrari et al., "Diffusion Reaction of Oxygen in HfO2/SiO2/Si Stacks," *The Journal of Physical Chemistry B*, vol. 110, No. 30, Jul. 12, 2006, pp. 14905-14910.

Driemeier et al., "Thermochemical behavior of hydrogen in hafnium silicate films on Si," Applied Physics Letters, vol. 89, Issue 5, Aug. 2006,—4 pages.

Driemeier et al., "Room temperature interactions of water vapor with Hf O2 films on Si," Applied Physics Letters, vol. 88, Issue 20, May 2006—3 pages.

Conley, Jr. et al., "Densification and improved electrical properties of pulse-deposited films via in situ modulated temperature annealing," *Applied Physics Letters*, vol. 84, Issue 11, Mar. 15, 2004, pp. 1913-1915.

Nakajima et al., "Experimental Demonstration of Higher-k phase HfO2 through Non-equilibrium Thermal Treatment," ECS Transactions 28.2 (2010), pp. 203-212.

Wu et al., "Device Performance and Reliability Improvement for MOSFETs With HfO2 Gate Dielectrics Fabricated Using Multideposition Room-Temperature Multiannealing," IEEE Electron Device Letters, vol. 32, Issue 9, Sep. 2011, pp. 1173-1175.

PCT International Search Report for corresponding PCT Application No. PCT/US2017/015211, dated Apr. 19, 2017, 3 pages.

PCT International Preliminary Report on Patentability for corresponding PCT Application No. PCT/US2017/015211, dated Aug. 16, 2018—10 pages.

\* cited by examiner

PRE-HEAT PROCESSES FOR MILLISECOND ANNEAL SYSTEM

PRIORITY CLAIM

The present application claims the benefit of priority of U.S. Provisional Application Ser. No. 62/289,519, titled "Pre-Heat Processes for Millisecond Anneal System," filed on Feb. 1, 2016, which is incorporated herein by reference.

FIELD

The present disclosure relates generally to thermal processing chambers and more particularly to millisecond anneal thermal processing chambers used for processing substrates, such as semiconductor substrates.

BACKGROUND

Millisecond anneal systems can be used for semiconductor processing for the ultra-fast heat treatment of substrates, such as silicon wafers. In semiconductor processing, fast heat treatment can be used as an anneal step to repair implant damage, improve the quality of deposited layers, improve the quality of layer interfaces, to activate dopants, and to achieve other purposes, while at the same time controlling the diffusion of dopant species.

Millisecond, or ultra-fast, temperature treatment of semiconductor substrates can be achieved using an intense and brief exposure of light to heat the entire top surface of the substrate at rates that can exceed $10^{4\circ}$ C. per second. The rapid heating of just one surface of the substrate can produce a large temperature gradient through the thickness of the substrate, while the bulk of the substrate maintains the temperature before the light exposure. The bulk of the substrate therefore acts as a heat sink resulting in fast cooling rates of the top surface.

SUMMARY

Aspects and advantages of embodiments of the present disclosure will be set forth in part in the following description, or may be learned from the description, or may be learned through practice of the embodiments.

One example aspect of the present disclosure is directed to a heat treatment process for a millisecond anneal system. The process includes receiving a substrate on a wafer support in a processing chamber of a millisecond anneal system; heating the substrate to an intermediate temperature; and heating the substrate using a millisecond heating flash. Prior to heating the substrate to the intermediate temperature, the process can include heating the substrate to a pre-bake temperature for a soak period.

Another example aspect of the present disclosure is directed to a method for thermally treating a substrate. The method includes receiving a substrate in a processing chamber having a wager plane plate dividing the processing chamber into a top chamber and a bottom chamber. The method includes heating the substrate to a pre-bake temperature using one or more heat sources located proximate the bottom chamber. During a soak period, the method includes maintaining the temperature of the substrate at about the pre-bake temperature. After the soak period, the method can include heating the substrate to increase the temperature of the substrate to an intermediate temperature.

Other example aspects of the present disclosure are directed to systems, methods, devices, and processes for thermally treating a semiconductor substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
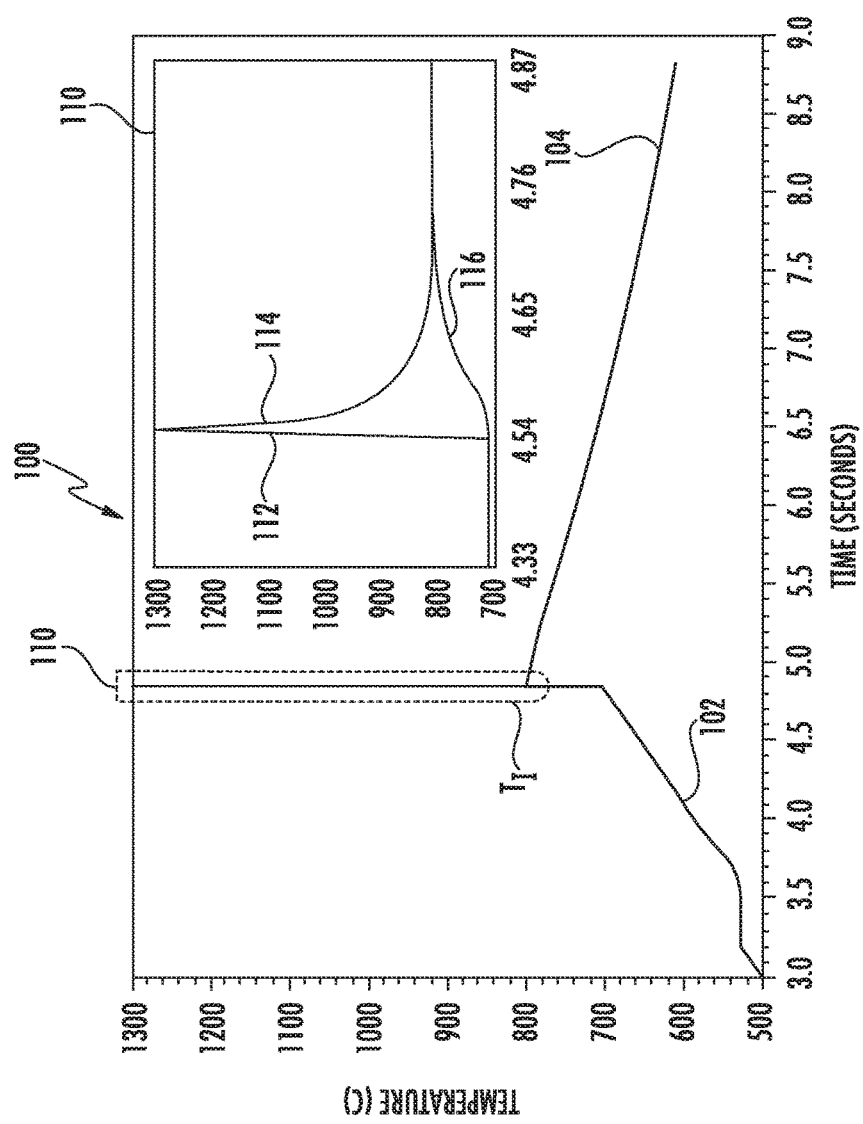
FIG. 1 depicts an example millisecond anneal heating profile according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to pre-heating processes for a millisecond anneal system to reduce or limits the growth of an oxide at an interface between the substrate and a dielectric film. Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any semiconductor substrate or other suitable substrate. In addition, the use of the term "about" in conjunction with a numerical value is intended to refer to within 10% of the stated numerical value.

Millisecond, or ultra-fast, thermal treatment of semiconductor wafers can be achieved using an intense and brief exposure of light (e.g., a "flash") to heat the entire top surface of the wafer at rates that can exceed $10^{4°}$ C. per second. A typical heat treatment cycle can include: (a) loading a cold semiconductor substrate into the chamber; (b) purging the chamber with, for instance, nitrogen gas (atmospheric pressure); (c) heating the semiconductor substrate to an intermediate temperature $T_i$; (d) millisecond heating by flash exposure of the top surface of the semiconductor substrate, while the bulk of the wafer remains at $T_i$; (e) rapid cool down by conductive cooling of the top surface of the semiconductor substrate with the bulk of the semiconductor substrate being the conductively coupled heat sink; (f) slow cool down of the bulk of the semiconductor substrate by thermal radiation and convection, with the process gas at atmospheric pressure as cooling agent; and (g) transport the semiconductor substrate back to the cassette.

The exact parameters of the processing steps in a heat treatment cycle (e.g., duration, temperature set-point, heating rate, etc.) are pre-scribed in a so-called process recipe. The recipe is editable and can be modified by a user. The recipe can be executed by an electronic system controller at run time. The controller can include one or more processors and one or memory devices. The memory devices can store the recipes as computer-readable instructions that when executed by the one or more processors cause the controller to implement the recipe.

The system can have a number of pre-defined recipes stored in the one or more memory devices. The type of application or heat treatment can determine which recipe is executed. Semiconductor substrates can be loaded onto the system by way of a FOUP (Front Opening Unified Pods) containing a cassette holding, for instance, twenty-five semiconductor substrates. An entity of twenty five semiconductor substrates can constitute a "batch", or a "lot" of semiconductor substrates. Typically a lot is processed with the same recipe. If there is no break between processing lots with the same recipe, the system can be said to be running in a continuous mode.

The process chamber in which such a treatment cycle is carried out is typically operated at atmospheric pressure with a controlled gas ambient. In some applications, the presence of oxygen needs to be avoided. For this purpose the ambient gas can be pure nitrogen. Other gases such as ammonia, hydrogen, deuterium, or forming gas, or mixtures hereof, can also be used. Other applications can exploit a wide range of gas ambients, for example oxygen, ozone, nitrogen oxides such as $N_2O$ and NO, mixtures of oxygen and hydrogen, and halogen-bearing compounds such as $NF_3$ or HCl.

In cases where film layers (e.g. dielectric film layers) have been deposited on the substrate in previous process steps, oxides can grow under the film during the thermal treatment of the substrates. The oxidant can be residual oxygen within the film itself. The oxide can often be a silicon oxide formed at the interface of the silicon or silicon-germanium surface of the semiconductor wafer. This oxide can result in a degradation of the electrical parameters of the device.

For example, the deposited film may be a film of a material with a relatively high dielectric constant. These "high-k" films have dielectric constants that are larger than that of silicon dioxide. High-k films are often used to form the gate dielectric for a transistor, or the dielectric employed in a capacitor. In these applications, it can be useful to maximize or increase the capacitance per unit area. However, if an oxide grows between the high-K film and the semiconductor substrate, then that tends to reduce the capacitance per unit area.

The rate of oxidation increases with the concentration of oxidizing species and the temperature. The high-K films are often deposited by atomic-layer deposition (ALD) or metalorganic chemical vapor deposition (MOCVD) and as a result they may include residual impurities from the deposition process, such as chemical precursors used in the deposition processes. For example species such as $H_2O$, OH, chlorine or carbon may remain in the film. Some of these species may increase undesirable oxidation of the substrate or may otherwise degrade the electrical characteristics.

One approach for quickly removing the residual oxygen from the film can be to employ a low pressure hydrogen ambient. The hydrogen can chemically react with the oxygen species or reduce any oxide that forms.

Example aspects of the present disclosure are directed to thermally processing semiconductor substrates using a preheat process that reduces or limits the growth of an oxide at an interface between the semiconductor wafer and the dielectric film. In some embodiments, the semiconductor substrate can be heated to a pre-bake temperature above room temperature before the normal millisecond anneal heat cycle is carried out.

For instance, in one example embodiment, a heat treatment process can include receiving a substrate on a wafer support in a processing chamber of a millisecond anneal system; heating the substrate to an intermediate temperature; and heating the substrate using a millisecond heating flash. Prior to heating the substrate to the intermediate temperature, the process can include heating the substrate to a pre-bake temperature for a soak period.

In some embodiments, the pre-bake temperature is selected to reduce a reaction rate for oxidation associated with the substrate. In some embodiments, the pre-bake temperature is selected to prevent inter-layer growth associated with the substrate. For instance, in some embodiments, the pre-bake temperature is in the range of about 200° C. to about 500° C. In some embodiments, the soak period can be between about 0.5 seconds and about 10 minutes, such as less than about 100 seconds, such as less than 30 seconds.

In some embodiments, the process can include admitting an ambient gas into the processing chamber. In some embodiments, the ambient gas can include nitrogen argon or helium. In some embodiments, the ambient gas can be at atmospheric pressure. In some embodiments the ambient gas can be at a pressure below about 1 Torr. In some embodiments, the ambient gas can include one or more of hydrogen, deuterium, ammonia, or hydrazine species. In some embodiments, the process includes inducing a plasma to create chemically reducing species. In some embodiments, a UV light source can be used to create excited species and radicals.

Another example aspect of the present disclosure is directed to a method for thermally treating a substrate. The method includes receiving a substrate in a processing chamber having a wager plane plate dividing the processing chamber into a top chamber and a bottom chamber. The method includes heating the substrate to a pre-bake temperature using one or more heat sources located proximate the bottom chamber. During a soak period, the method includes maintaining the temperature of the substrate at about the pre-bake temperature. After the soak period, the method can include heating the substrate to increase the temperature of the substrate to an intermediate temperature. In some embodiments, the pre-bake temperature can be in the range of about 200° C. to about 500° C. In some embodiments, the soak period can be between about 0.5 seconds and about 10 minutes.

In some embodiments, the method can include admitting an ambient gas into the processing chamber before or during the soak period. The ambient gas can include one or more of hydrogen, deuterium, ammonia, or hydrazine species. In some embodiments, the method can include inducing a plasma in the processing chamber to create chemically reducing species before or during the soak period. In some embodiments, UV light can be used to create excited species and radicals.

In some embodiments, after the soak period, the method can include heating the substrate to increase the temperature of the substrate to an intermediate temperature. After heating the substrate to the intermediate temperature, the method can include heating the substrate using a millisecond heating flash.

Example Millisecond Anneal Systems

An example millisecond anneal system can be configured to provide an intense and brief exposure of light to heat the top surface of a wafer at rates that can exceed, for instance, about $10^{4°}$ C./s. FIG. 1 depicts an example temperature profile 100 of a semiconductor substrate achieved using a millisecond anneal system. As shown in FIG. 1, the bulk of the semiconductor substrate (e.g., a silicon wafer) is heated to an intermediate temperature $T_i$ during a ramp phase 102. The intermediate temperature can be in the range of about 450° C. to about 900° C. When the intermediate temperature $T_i$ is reached, the top side of the semiconductor substrate can be exposed to a very short, intense flash of light resulting in heating rates of up to about $10^{4°}$ C./s. Window 110 illustrates the temperature profile of the semiconductor substrate during the short, intense flash of light. Curve 112 represents the rapid heating of the top surface of the semiconductor substrate during the flash exposure. Curve 116 depicts the temperature of the remainder or bulk of the semiconductor substrate during the flash exposure. Curve 114 represents the rapid cool down by conductive of cooling of the top surface of the semiconductor substrate by the bulk of the semiconductor substrate acting as a heat sink. The bulk of the semiconductor substrate acts as a heat sink generating high top side cooling rates for the substrate. Curve 104 represents the slow cool down of the bulk of the semiconductor substrate by thermal radiation and convection, with a process gas as a cooling agent. According to example aspects of the present disclosure, a thermal process can include heating the semiconductor substrate to a pre-bake temperature for a soak period prior to heating the substrate to the intermediate temperature (see FIG. 15).

An example millisecond anneal system can include a plurality of arc lamps (e.g., four Argon arc lamps) as light sources for intense millisecond long exposure of the top surface of the semiconductor substrate—the so called "flash." The flash can be applied to the semiconductor substrate when the substrate has been heated to an intermediate temperature (e.g., about 450° C. to about 900° C.). A plurality of continuous mode arc lamps (e.g., two Argon arc lamps) or other lamps (e.g., tungsten lamps) can be used to heat the semiconductor substrate to the pre-bake temperature and/or the intermediate temperature. In some embodiments, the heating of the semiconductor substrate to the pre-bake temperature and/or the intermediate temperature is accomplished through the bottom surface of the semiconductor substrate at a ramp rate which heats the entire bulk of the wafer.

Figure 2:
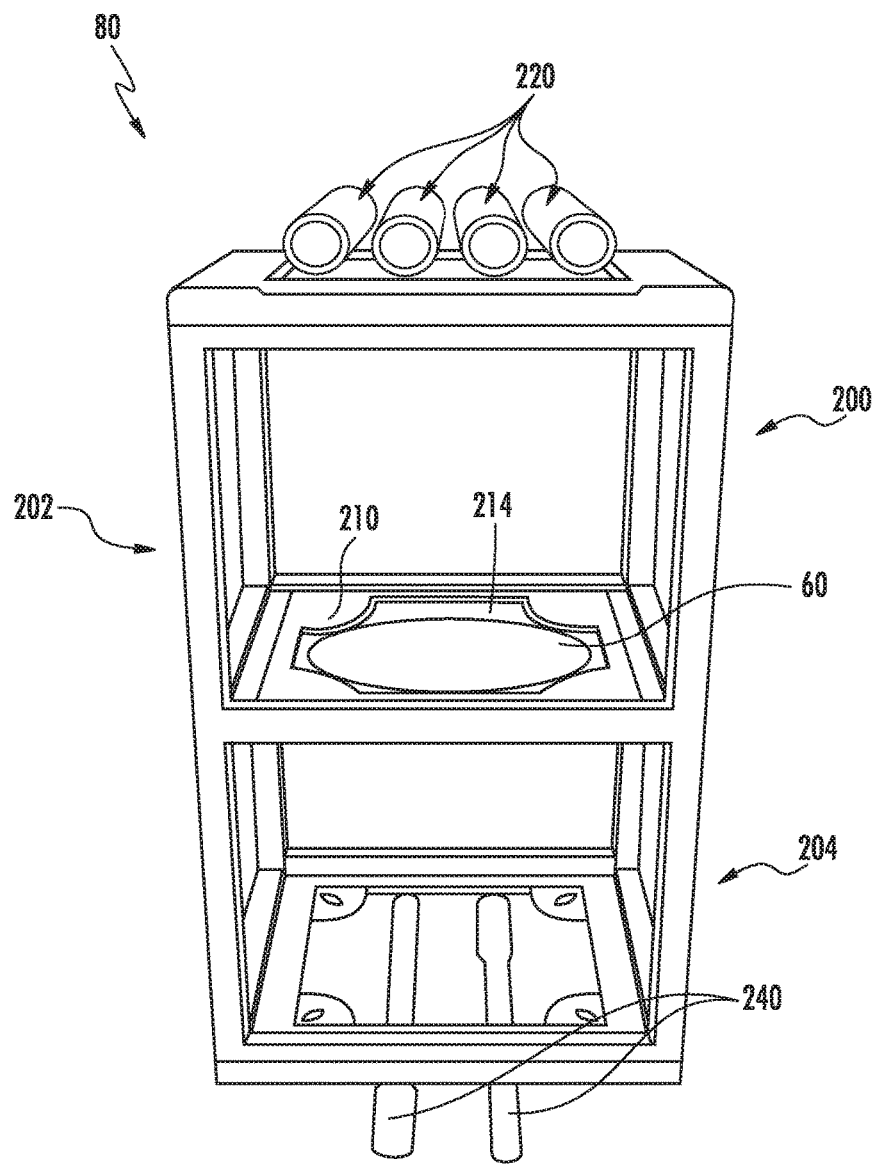
FIG. 2 depicts an example perspective view of a portion of an example millisecond anneal system according to example embodiments of the present disclosure.
Figure 3:
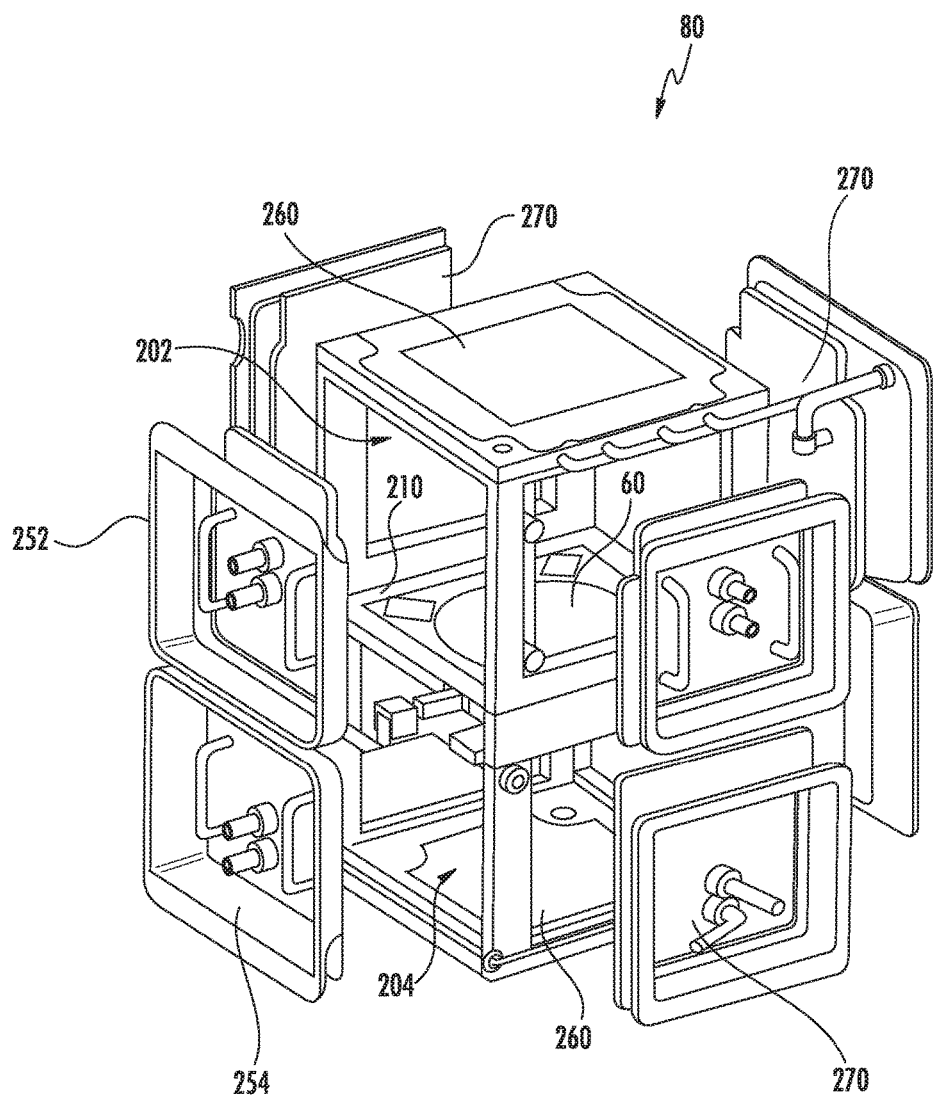
FIG. 3 depicts an exploded view of an example millisecond anneal system according to example embodiments of the present disclosure.
Figure 4:
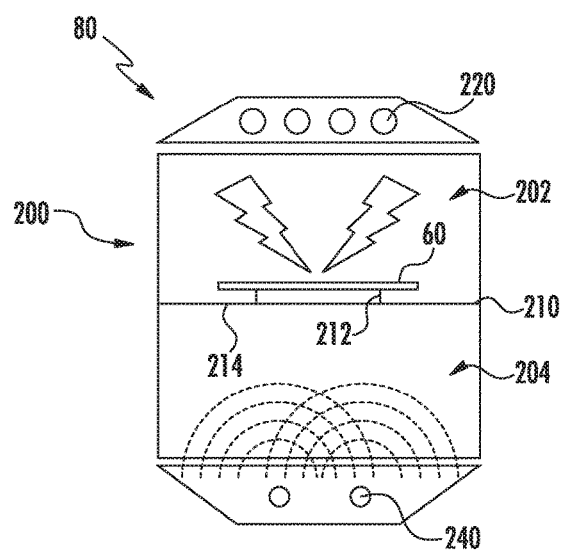
FIG. 4 depicts a cross-sectional view of an example millisecond anneal system according to example embodiments of the present disclosure.

FIGS. 2 to 5 depict various aspects of an example millisecond anneal system 80 according to example embodiments of the present disclosure. As shown in FIGS. 2-4, a millisecond anneal system 80 can include a process chamber 200. The process chamber 200 can be divided by a wafer plane plate 210 into a top chamber 202 and a bottom chamber 204. A semiconductor substrate 60 (e.g., a silicon wafer) can be supported by support pins 212 (e.g., quartz support pins) mounted to a wafer support plate 214 (e.g., quartz glass plate inserted into the wafer plane plate 210).

As shown in FIGS. 2 and 4, the millisecond anneal system 80 can include a plurality of arc lamps 220 (e.g., four Argon arc lamps) arranged proximate the top chamber 202 as light sources for intense millisecond long exposure of the top surface of the semiconductor substrate 60—the so called "flash." The flash can be applied to the semiconductor substrate when the substrate has been heated to an intermediate temperature (e.g., about 450° C. to about 900° C.).

A plurality of continuous mode arc lamps 240 (e.g., two Argon arc lamps) located proximate the bottom chamber 204 can be used to heat the semiconductor substrate 60 to the pre-bake temperature and/or the intermediate temperature. In some embodiments, the heating of the semiconductor substrate 60 to the pre-bake temperature and/or the intermediate temperature is accomplished from the bottom chamber 204 through the bottom surface of the semiconductor substrate at a ramp rate which heats the entire bulk of the semiconductor substrate 60.

As shown in FIG. 3, the light to heat the semiconductor substrate 60 from the bottom arc lamps 240 (e.g., for use in heating the semiconductor substrate to an intermediate temperature) and from the top arc lamps 220 (e.g., for use in providing millisecond heating by flash) can enter the processing chamber 200 through water windows 260 (e.g., water cooled quartz glass windows). In some embodiments, the water windows 260 can include a sandwich of two quartz glass panes between which an about a 4 mm thick layer of water is circulating to cool the quartz panes and to provide an optical filter for wavelengths, for instance, above about 1400 nm.

Figure 5:
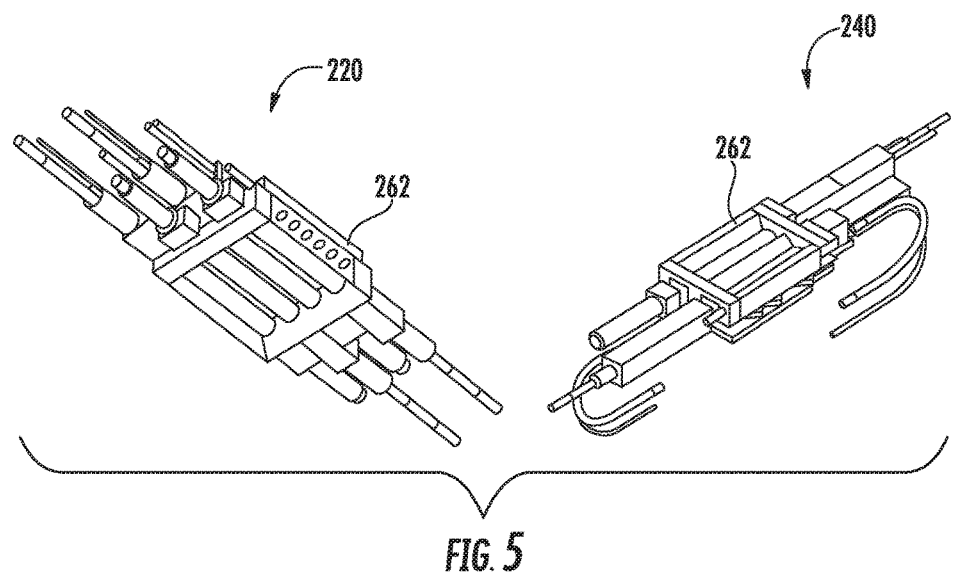
FIG. 5 depicts a perspective view of example lamps used in a millisecond anneal system according to example embodiments of the present disclosure.

As further illustrated in FIG. 3, process chamber walls 250 can include reflective mirrors 270 for reflecting the heating light. The reflective mirrors 270 can be, for instance, water cooled, polished aluminum panels. In some embodiments, the main body of the arc lamps used in the millisecond anneal system can include reflectors for lamp radiation. For instance, FIG. 5 depicts a perspective view of both a top lamp array 220 and a bottom lamp array 240 that can be used in the millisecond anneal system 200. As shown, the main body of each lamp array 220 and 240 can include a reflector 262 for reflecting the heating light. These reflectors 262 can form a part of the reflecting surfaces of the process chamber 200 of the millisecond anneal system 80.

The temperature uniformity of the semiconductor substrate can be controlled by manipulating the light density falling onto different regions of the semiconductor substrate. In some embodiments, uniformity tuning can be accomplished by altering the reflection grade of small size reflectors to the main reflectors and/or by use of edge reflectors mounted on the wafer support plane surrounding the wafer.

Figure 6:
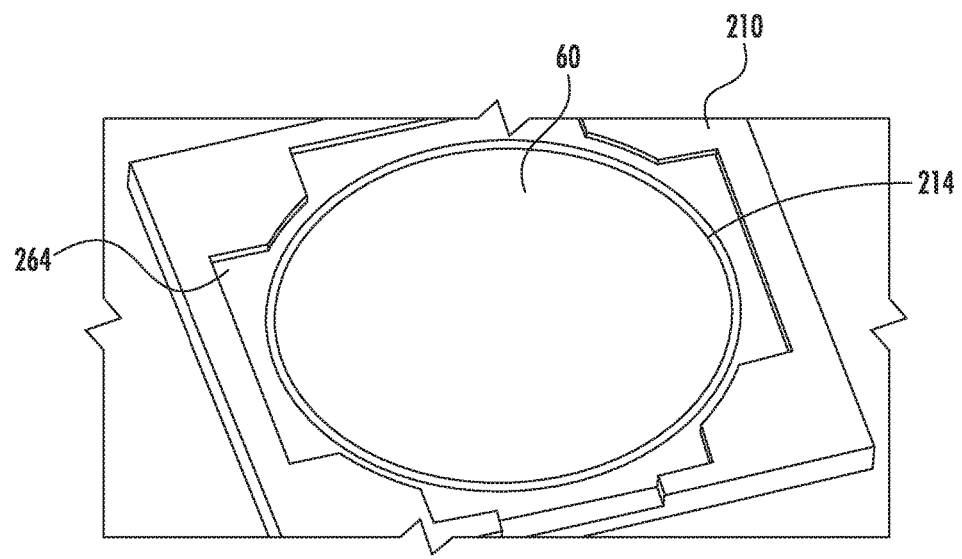
FIG. 6 depicts example edge reflectors used in a wafer plane plate of a millisecond anneal system according to example embodiments of the present disclosure.

For instance, edge reflectors can be used to redirect light from the bottom lamps 240 to an edge of the semiconductor substrate 60. As an example, FIG. 6 depicts example edge reflectors 264 that form a part of the wafer plane plate 210 that can be used to direct light from the bottom lamps 240 to the edge of the semiconductor substrate 60. The edge reflectors 264 can be mounted to the wafer plane plate 210 and can surround or at least partially surround the semiconductor substrate 60.

Figure 7:
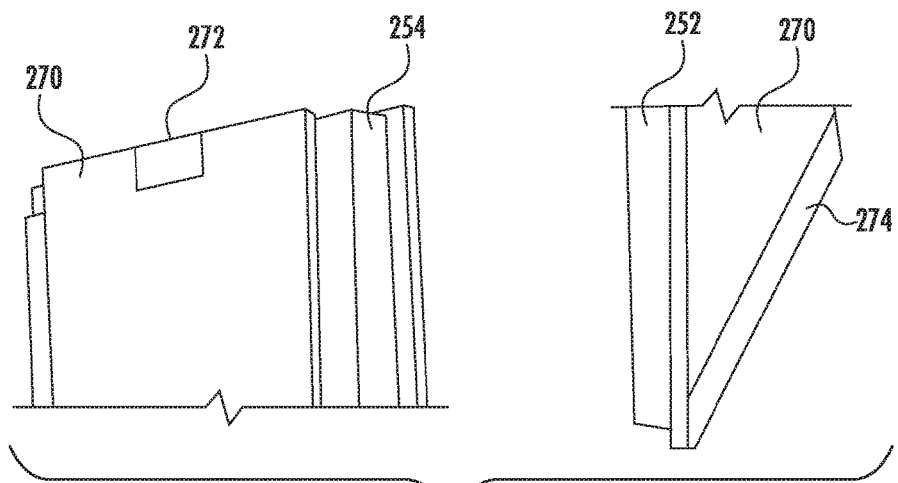
FIG. 7 depicts example reflectors that can be used in a millisecond anneal system according to example embodiments of the present disclosure.

In some embodiments, additional reflectors can also be mounted on chamber walls near the wafer plane plate 210. For example, FIG. 7 depicts example reflectors that can be mounted to the process chamber walls that can act as reflector mirrors for the heating light. More particularly, FIG. 7 shows an example wedge reflector 272 mounted to lower chamber wall 254. FIG. 7 also illustrates a reflective element 274 mounted to reflector 270 of an upper chamber wall 252. Uniformity of processing of the semiconductor substrate 60 can be tuned by changing the reflection grade of the wedge reflectors 272 and/or other reflective elements (e.g., reflective element 274) in the processing chamber 200.

Figure 8:
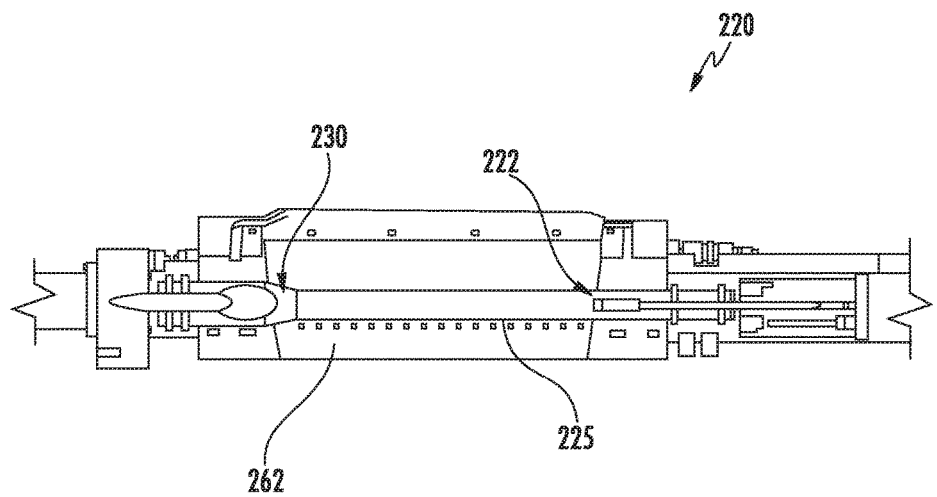
FIG. 8 depicts an example arc lamp that can be used in a millisecond anneal system according to example embodiments of the present disclosure.
Figure 9:
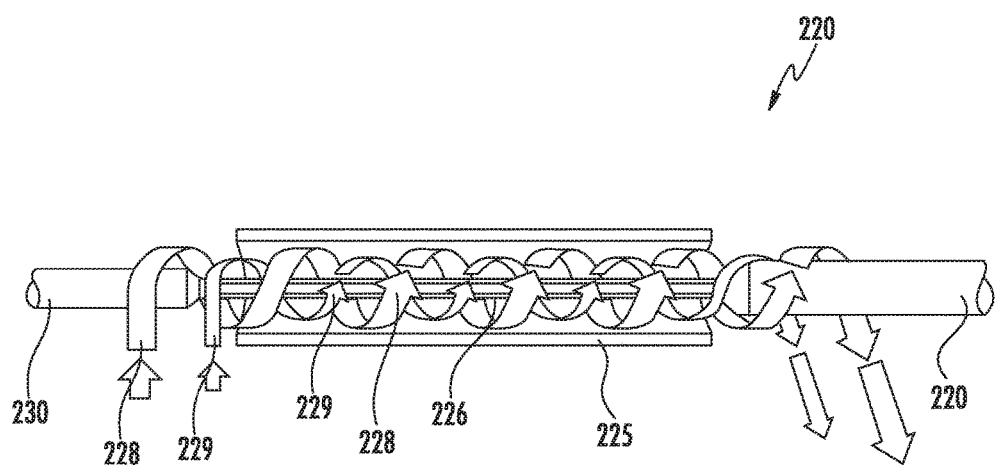
FIGS. 9-10 depict the operation of an example arc lamp according to example embodiments of the present disclosure.

FIGS. 8-11 depict aspects of example upper arc lamps 220 that can be used as light sources for intense millisecond long exposure of the top surface of the semiconductor substrate 60 (e.g., the "flash"). For instance, FIG. 8 depicts a cross-sectional view of an example arc lamp 220. The arc lamp 220 can be, for instance, an open flow arc lamp, where pressurized Argon gas (or other suitable gas) is converted into a high pressure plasma during an arc discharge. The arc discharge takes place in a quartz tube 225 between a negatively charged cathode 222 and a spaced apart positively charged anode 230 (e.g., spaced about 300 mm apart). As soon as the voltage between the cathode 222 and the anode 230 reaches a breakdown voltage of Argon (e.g., about 30 kV) or other suitable gas, a stable, low inductive plasma is formed which emits light in the visible and UV range of the electromagnetic spectrum. As shown in FIG. 9, the lamp can include a lamp reflector 262 that can be used to reflect light provided by the lamp for processing of the semiconductor substrate 60.

Figure 10:
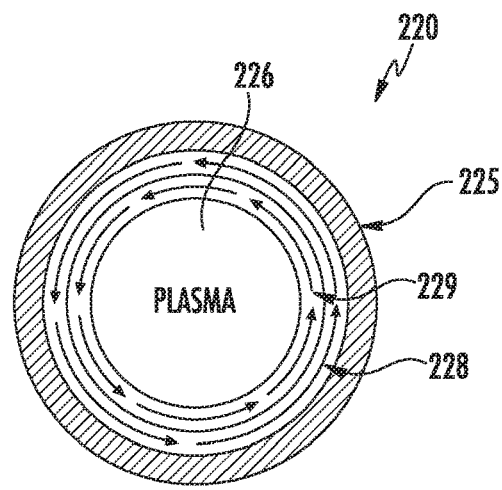
Figure 11:
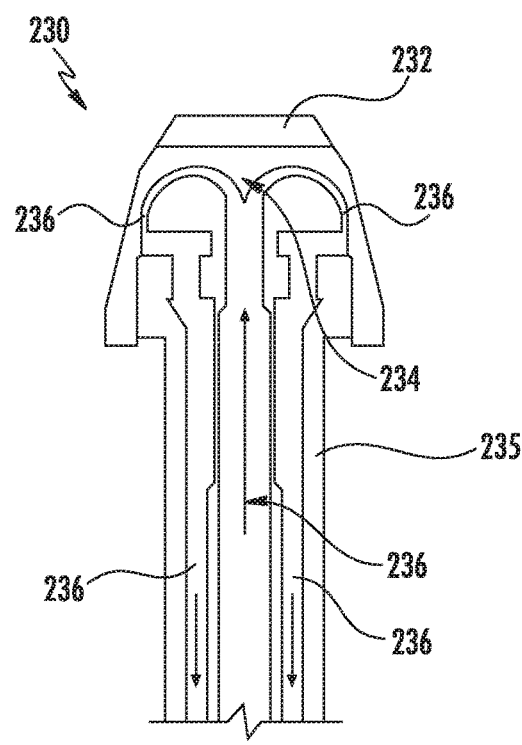
FIG. 11 depicts a cross-sectional view of an example electrode according to example embodiments of the present disclosure.

FIGS. 10 and 11 depict aspects of example operation of an arc lamp 220 in millisecond anneal system 80 according to example embodiments of the present disclosure. More particularly, a plasma 226 is contained within a quartz tube 225 which is water cooled from the inside by a water wall 228. The water wall 228 is injected at high flow rates on the cathode end of the lamp 200 and exhausted at the anode end. The same is true for the Argon gas 229, which is also entering the lamp 220 at the cathode end and exhausted from the anode end. The water forming the water wall 228 is injected perpendicular to the lamp axis such that the centrifugal action generates a water vortex. Hence, along the center line of the lamp a channel is formed for the Argon gas 229. The Argon gas column 229 is rotating in the same direction as the water wall 228. Once a plasma 226 has formed, the water wall 228 is protecting the quartz tube 225 and confining the plasma 226 to the center axis. Only the water wall 228 and the electrodes (cathode 230 and anode 222) are in direct contact with the high energy plasma 226.

FIG. 11 depicts a cross sectional view of an example electrode (e.g., cathode 230) used in conjunction with an arc lamp according to example embodiments of the present disclosure. FIG. 11 depicts a cathode 230. However, a similar construction can be used for the anode 222.

In some embodiments, as the electrodes experience a high heat load, one or more of the electrodes can each include a tip 232. The tip can be made from tungsten. The tip can be coupled to and/or fused to a water cooled copper heat sink 234. The copper heat sink 234 can include at least a portion the internal cooling system of the electrodes (e.g., one or more water cooling channels 236. The electrodes can further include a brass base 235 with water cooling channels 236 to provide for the circulation of water or other fluid and the cooling of the electrodes.

The arc lamps used in example millisecond anneal systems according to aspects of the present disclosure can be an open flow system for water and Argon gas. However, for conservation reasons, both media can be circulated in a close loop system in some embodiments.

Figure 12:
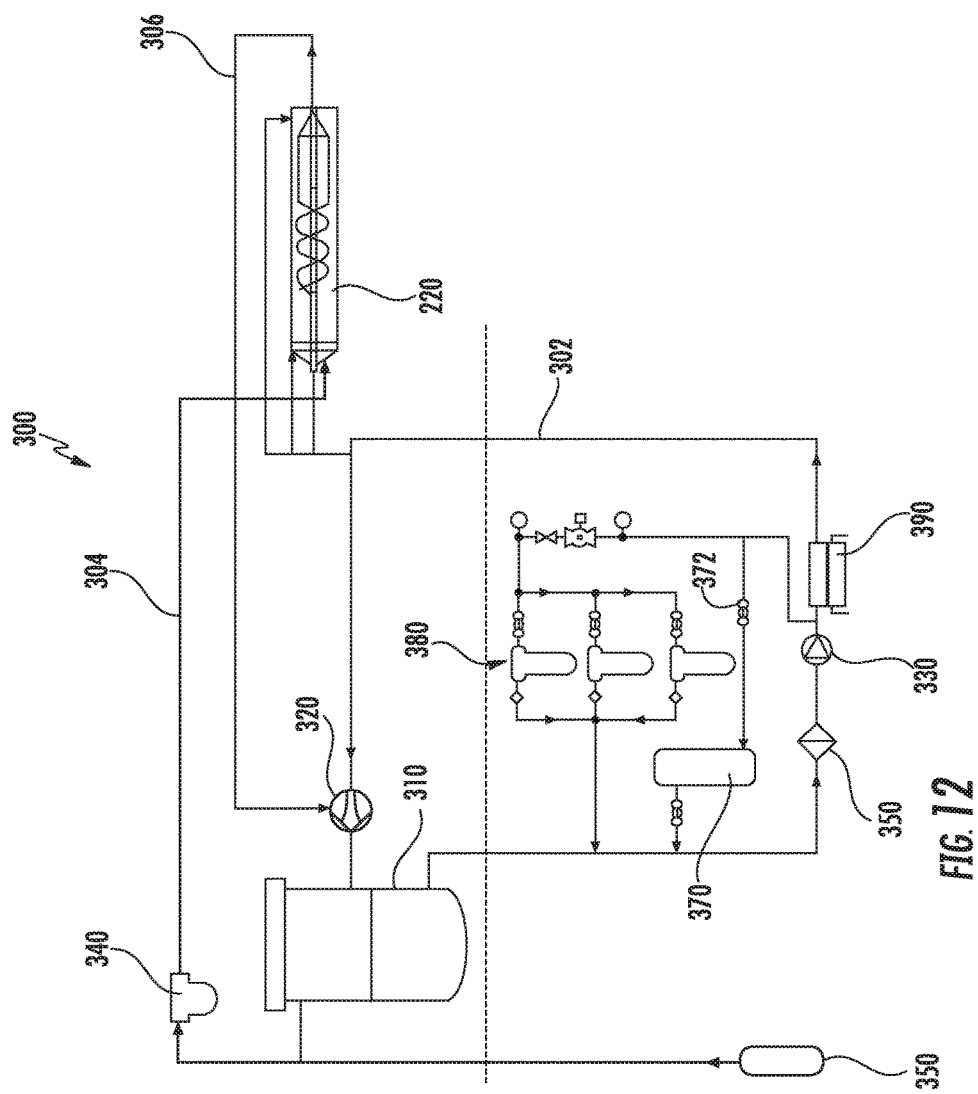
FIG. 12 depicts an example closed loop system for supplying water and gas (e.g., Argon gas) to example arc lamps used in a millisecond anneal system according to example embodiments of the present disclosure.

FIG. 12 depicts an example closed loop system 300 for supplying water and Argon gas needed to operate the open flow Argon arc lamps used in millisecond anneal systems according to example embodiments of the present disclosure.

More particularly, high purity water 302 and Argon 304 is fed to the lamp 220. The high purity water 302 is used for the water wall and the cooling of the electrodes. Leaving the lamp is a gas/water mixture 306. This water/gas mixture 306 is separated into gas free water 302 and dry Argon 304 by separator 310 before it can be re-fed to the inlets of the lamp 220. To generate the required pressure drop across the lamp 220, the gas/water mixture 306 is pumped by means of a water driven jet pump 320.

A high power electric pump 330 supplies the water pressure to drive the water wall in the lamp 220, the cooling water for the lamp electrodes, and the motive flow for the jet pump 320. The separator 310 downstream to the jet pump 320 can be used extracting the liquid and the gaseous phase from the mixture (Argon). Argon is further dried in a coalescing filter 340 before it re-enters the lamp 220. Additional Argon can be supplied from Argon source 350 if needed.

The water is passing through one or more particle filters 350 to remove particles sputtered into the water by the arc. Ionic contaminations are removed by ion exchange resins. A portion of water is run through mixed bed ion exchange filters 370. The inlet valve 372 to the ion exchange bypass 370 can be controlled by the water resistivity. If the water resistivity drops below a lower value the valve 372 is opened, when it reaches an upper value the valve 372 is closed. The system can contain an activated carbon filter bypass loop 380 where a portion of the water can be additionally filtered to remove organic contaminations. To maintain the water temperature, the water can pass through a heat exchanger 390.

Figure 13:
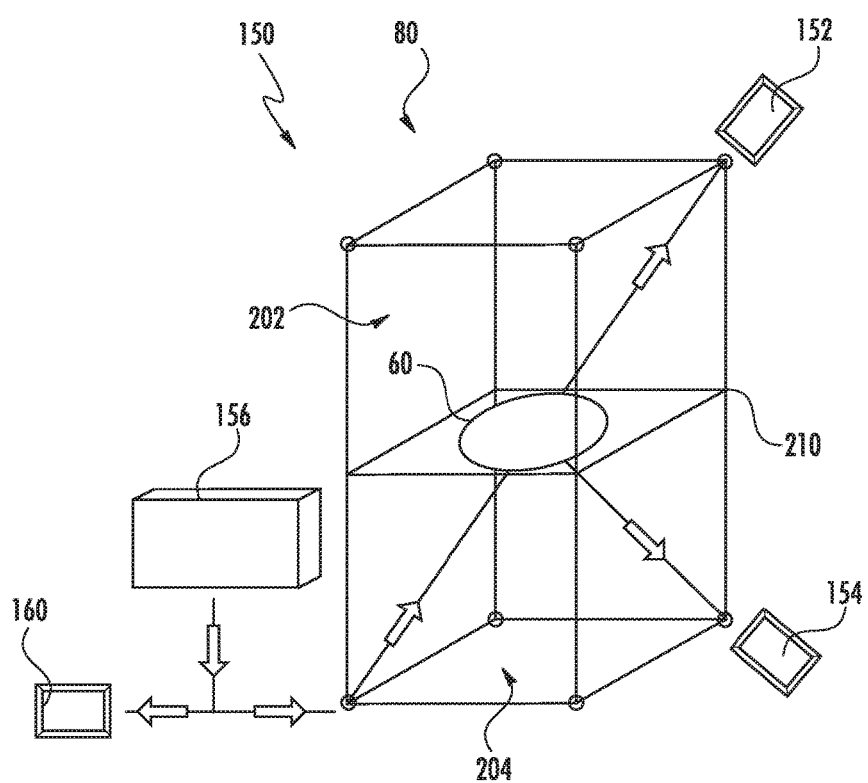
FIG. 13 depicts an example temperature measurement system for a millisecond anneal system according to example embodiments of the present disclosure.

Millisecond anneal systems according to example embodiments of the present disclosure can include the ability to independently measure temperature of both surfaces (e.g., the top and bottom surfaces) of the semiconductor substrate. FIG. 13 depicts an example temperature measurement system 150 for millisecond anneal system 200.

A simplified representation of the millisecond anneal system 200 is shown in FIG. 13. The temperature of both sides of a semiconductor substrate 60 can be measured independently by temperature sensors, such as temperature sensor 152 and temperature sensor 154. Temperature sensor 152 can measure a temperature of a top surface of the semiconductor substrate 60. Temperature sensor 154 can measure a bottom surface of the semiconductor substrate 60. In some embodiments, narrow band pyrometric sensors with a measurement wavelength of about 1400 nm can be used as temperature sensors 152 and/or 154 to measure the temperature of, for instance, a center region of the semiconductor substrate 60. In some embodiments, the temperature sensors 152 and 154 can be ultra-fast radiometers (UFR) that have a sampling rate that is high enough to resolve the millisecond temperature spike cause by the flash heating.

The readings of the temperature sensors 152 and 154 can be emissivity compensated. As shown in FIG. 13, the emissivity compensation scheme can include a diagnostic flash 156, a reference temperature sensor 158, and the temperature sensors 152 and 154 configured to measure the top and bottom surface of the semiconductor wafers. Diagnostic heating and measurements can be used with the diagnostic flash 156 (e.g., a test flash). Measurements from reference temperature sensor 158 can be used for emissivity compensation of temperature sensors 152 and 154

In some embodiments, the millisecond anneal system 200 can include water windows. The water windows can provide an optical filter that suppresses lamp radiation in the measurement band of the temperature sensors 152 and 154 so that the temperature sensors 152 and 154 only measure radiation from the semiconductor substrate.

The readings of the temperature sensors 152 and 154 can be provided to a processor circuit 160. The processor circuit 160 can be located within a housing of the millisecond anneal system 200, although alternatively, the processor circuit 160 may be located remotely from the millisecond anneal system 200. The various functions described herein may be performed by a single processor circuit if desired, or by other combinations of local and/or remote processor circuits.

Figure 16:
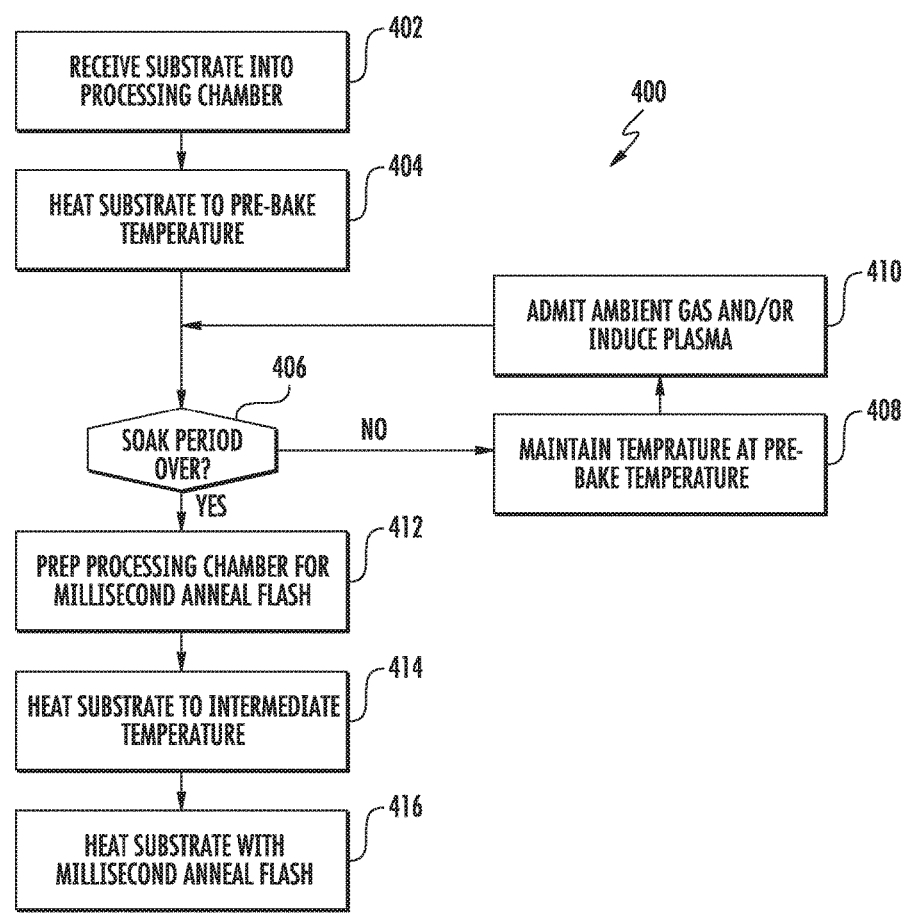
FIG. 16 depicts a flow diagram of an example method according to example embodiments of the present disclosure.

As will be discussed in detail below, the temperature measurement system can include other temperature sensors, such as a temperature sensor configured to obtain one or more temperature measurements of a wafer support plate (e.g., as shown in FIG. 16) and/or a far infrared temperature sensor (e.g., as shown in FIG. 22) configured to obtain one or more temperature measurements of a semiconductor substrate at temperatures below, for instance, about 450° C., such as less than about 300° C., such as less than about 250° C. The processor circuit 160 can be configured to process measurements obtained from the temperature sensors to determine a temperature of the semiconductor substrate and/or the wafer support plate.

Figure 14:
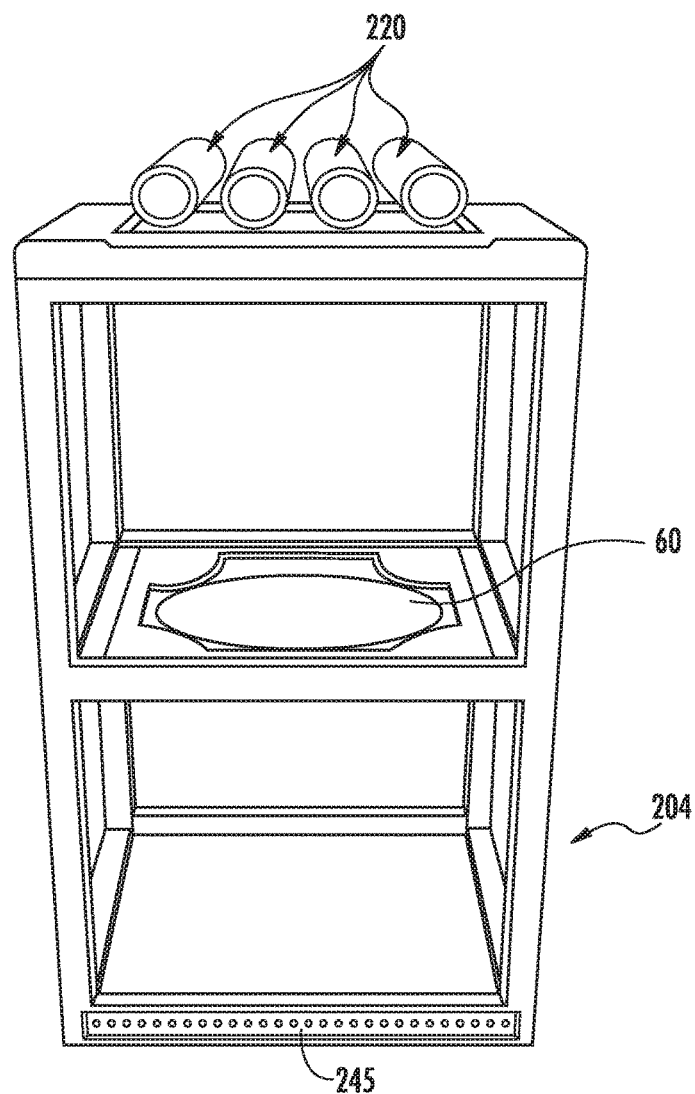
FIG. 14 depicts an example millisecond anneal system with tungsten halogen lamps for heating the semiconductor substrate according to example embodiments of the present disclosure.

An alternative source for heating the semiconductor substrate to an intermediate temperature $T_i$ can be an array of tungsten halogen lamps located in the bottom processing chamber. For instance, two continuous mode arc lamps can each have each an electrical power of 125 kW for a total power of 250 kW. An array of 40 tungsten halogen lamps with 6 kW each can provide the same power. FIG. 14 depicts an example millisecond anneal system with tungsten halogen lamps 245 for heating the semiconductor substrate 60 to the pre-bake temperature and/or the intermediate temperature $T_i$. An advantage of heating with halogen lamps is an economical one. Tungsten halogen lamps can be less expensive and can have a much longer lifetime. Also the tungsten halogen lamps can only require electrical connections, omitting the need for expensive water cooling and water treatment units.

Example Preheat Processes for Reducing Oxide Growth

Example aspects of the present disclosure are directed to thermally processing wafers while reducing the growth of the oxide at an interface between the substrate and a dielectric film, or even reducing the thickness of the interlayer. The preheat processes according to example aspects of the present disclosure can also improve the electrical quality of the film stack by eliminating the effects of undesired impurities.

In some embodiments, the semiconductor substrate can be heated to a pre-bake temperature above room temperature and less than the intermediate temperature before the normal heat cycle is carried out. An upper temperature limit of the pre-bake temperature can be set such that the reaction rate for oxidation is low enough to prevent inter-layer growth (e.g., typically <about 500° C.). A lower limit of the pre-bake temperature can be set such that the outgassing rate of the oxidizing species or other undesired species is high enough to complete the removal of the oxidizing species or other undesired species in a short enough time (e.g., typically >about 200° C.).

The time spent at the prebake temperature can be selected (e.g., optimized) to provide the shortest total recipe time for optimized wafer throughput, while making sure that an adequate time is provided for the undesired species to leave the film. This period can be referred to as the "soak period." In some embodiments, the soak period at the prebake temperature can be between about 0.5 seconds and about 10 minutes, such as less than about 100 seconds, such as less than about 30 seconds.

The whole process can be carried out in a relatively inert gas ambient such as in nitrogen, argon or helium at atmospheric pressure, but it could also be carried out in a low pressure environment, for example at a pressure below 1 Torr. It could also be performed with the assistance of species that can assist in the desorption of undesired species, help to reduce the oxide and react with any residual oxidizing species. For this purposes gas ambient can also contain hydrogen, deuterium, ammonia or hydrazine species. These gases can be mixed with one of the relatively inert gas species.

It is also possible to increase the reaction rates by employing a plasma source to create the chemically reducing species while keeping the wafer temperature relatively low. For example a plasma source could provide hydrogen or deuterium radicals in the vicinity of the semiconductor substrate. Although the focus here is mainly on reducing species, it is also possible to use oxidizing species during the low temperature soak, provided that the temperature is kept low enough and soak time short enough that these species do not themselves cause interlayer growth. For example, oxidizing species such as oxygen molecules or oxygen radicals (e.g. from a plasma) could help to remove impurities in the film or at its surface. Reactive species can also be generated by UV energy sources, such as the heating arc lamps or other UV sources.

Figure 15:
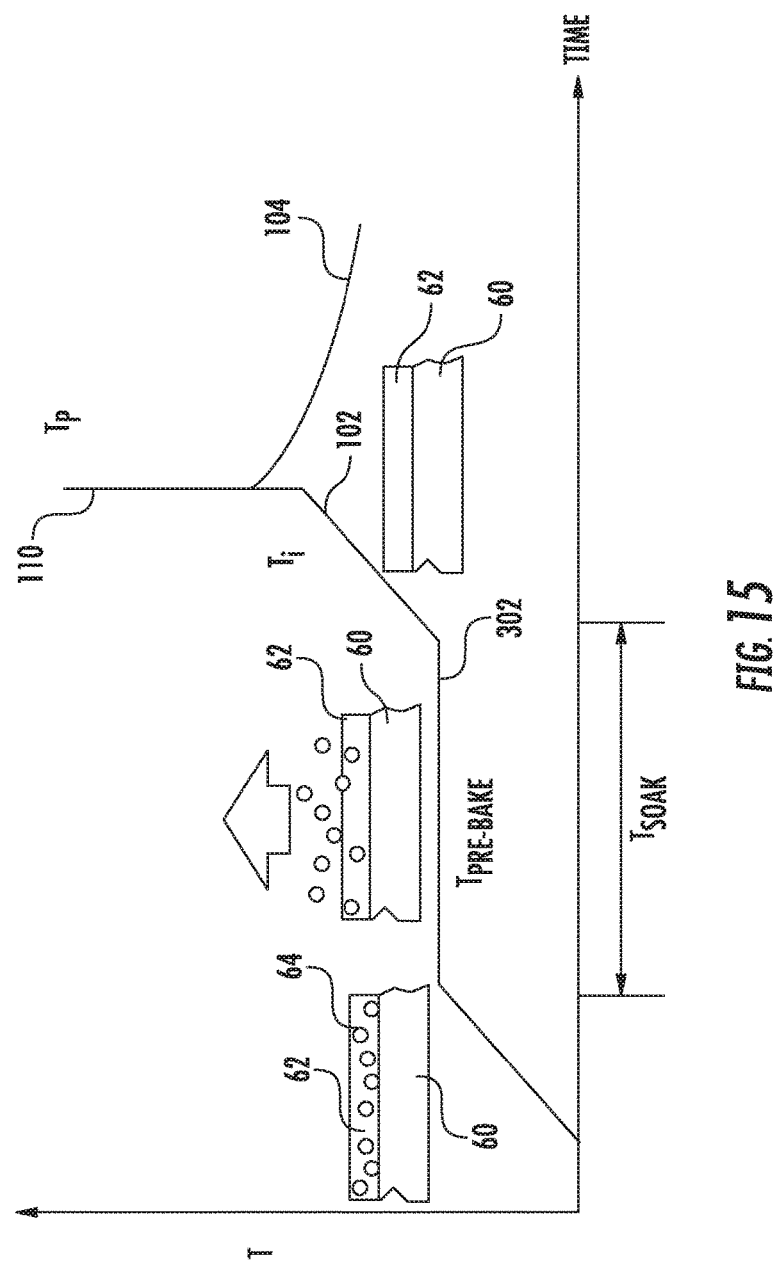
FIG. 15 depicts an example heat cycle with pre-bake during a soak period to outgas oxidizing species before the ramp to an intermediate temperature for a millisecond anneal flash according to example embodiments of the present disclosure.

FIG. 15 depicts on example heat cycle with pre-bake during a soak period to outgas oxidizing species before the ramp to an intermediate temperature for a millisecond anneal flash according to example embodiments of the present disclosure. As shown, a substrate 60 with a film 62 having reactive species 64 can be heated to a pre-bake temperature $T_{Pre-Bake}$. The pre-bake temperature $T_{Pre-Bake}$ can be in the range of, for instance, about 200° C. to about 500° C. The substrate 60 can be maintained at the pre-bake temperature for a soak period $t_{soak}$. Reactive species 64 can be outgassed during the soak period $t_{soak}$. The soak period $t_{soak}$ can be in the range of, for instance, about 0.5 seconds and about 10 minutes, such as less than about 100 seconds, such as less than about 30 seconds. The temperature can then be ramped to the intermediate temperature prior to receiving a millisecond anneal flash according to example embodiments of the present disclosure.

FIG. 16 depicts a flow diagram of an example method (400) according to example embodiments of the present disclosure. FIG. 16 depicts steps performed in a particular order for purposes of illustration and discussion. Those of ordinary skill in the art, using the disclosures provided herein, will understand that various steps of any of the methods described herein can be omitted, expanded, modified, performed simultaneously, and/or rearranged without deviating from the scope of the present disclosure.

At (402), the method can include receiving a substrate on a wafer support in a processing chamber of a millisecond anneal system. For instance, the substrate can be received onto a wafer support provided as part of a wafer plane plate dividing a processing chamber associated with a millisecond anneal system into a top chamber and a bottom chamber.

At (404), the method can include heating the substrate to a pre-bake temperature. As discussed above, the pre-bake temperature can be selected to reduce a reaction rate for oxidation of the substrate and/or to prevent inter-layer growth. In some embodiments, the pre-bake temperature can be in the range of about 200° C. to about 500° C. In some embodiments, the substrate can be heated to the pre-bake temperature using heat sources (e.g., arc lamps, tungsten halogen lamps) located proximate to a bottom chamber of the millisecond anneal system.

At (406), the method can include determining whether a soak period is over. The soak period can be a period of time that is long enough to provide for the undesired species to leave the film, but not so long as to unnecessarily affect total process time. In some embodiments, the soak period at the prebake temperature can be between about 0.5 seconds and about 10 minutes, such as less than about 100 seconds, such as less than about 30 seconds.

If the soak period is not over, the method can include maintaining the temperature at the pre-bake temperature as shown at (408). The method can also optionally include admitting an ambient gas species that can assist in the desorption of undesired species, help to reduce the oxide and react with any residual oxidizing species as shown at (410). For instance, the ambient gas can include hydrogen, deuterium, ammonia, and/or hydrazine species. These gases can be mixed with one of the relatively inert gas species, e.g. nitrogen.

In some embodiments, the method can also include at (410) employing a plasma source to induce a plasma to create chemically reducing species while keeping the wafer temperature relatively low. For example a plasma source can provide hydrogen or deuterium radicals in the vicinity of the semiconductor substrate.

Species can also be used to improve the film quality by passivating defects in the films. For example, oxygen or nitrogen-containing species can help to passivate defects, but the process conditions must be selected to limit the extent of the oxide interlayer growth. The low temperature soak conditions can be selected to assist this defect passivation process. It can also be useful to use a source of ultra-violet (UV) radiation to produce excited species and radicals that assist in impurity removal and defect passivation. The UV energy source can be any of the arc lamps in the system, which produce significant radiant power at wavelengths below 350 nm. For example, UV wavelengths can excite oxygen, nitrogen, NO, N2O, hydrazine, hydrogen, ammonia, water vapor, and/or halogen-containing species such as trichloroethylene, dichloroethylene, trichloroethane, HCl or NF3, to create a variety of reactive species, including excited molecules and radicals, or even other chemical species such as ozone. These species can be produced by absorption of UV radiation in the gas phase near the wafer and also by excitation of species adsorbed at the surface of the wafer, or even in the thin films on the wafer surface. Other UV energy sources can be used to provide the UV light, for example other arc lamps such as Xe- or Kr-arc lamps. Hg-lamps, deuterium lamps, excimer lamps, UV lasers or UV LEDs could also be used. Light sources that generate relatively short UV wavelengths (e.g., less than about 250 nm) can be useful for some applications, including generated excited nitrogen species from ammonia.

Once the soak period is complete, the method can include prepping the processing chamber for a millisecond anneal flash as shown at (412). For instance, the ambient gas admitted at (410) can be purged and an inert gas (e.g., nitrogen gas) can be admitted into the processing chamber. The method can then include heating the substrate to the intermediate temperature (414) and heating the substrate using a millisecond anneal flash (416) as described herein.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A heat treatment process for a millisecond anneal system, the process comprising:
receiving a substrate on a wafer support in a processing chamber of a millisecond anneal system;
heating the substrate to an intermediate temperature; and
after heating the substrate to the intermediate temperature, then heating the substrate using a heating flash to a temperature that is greater than the intermediate temperature;
wherein prior to heating the substrate to the intermediate temperature, the process comprises heating the substrate to a pre-bake temperature for a soak period;
wherein heating the substrate to the intermediate temperature is implemented by ramping a temperature of the substrate from the pre-bake temperature to the intermediate temperature during a ramp phase.

2. The heat treatment process of claim 1, wherein the pre-bake temperature is selected to reduce a reaction rate for oxidation associated with the substrate.

3. The heat treatment process of claim 1, wherein the pre-bake temperature is selected to prevent inter-layer growth associated with the substrate.

4. The heat treatment process of claim 1, wherein the pre-bake temperature is in the range of about 200° C. to about 500° C.

5. The heat treatment process of claim 1, wherein the soak period is between about 0.5 seconds and about 10 minutes.

6. The heat treatment process of claim 1, wherein the soak period is less than about 100 seconds.

7. The heat treatment process of claim 1, wherein the soak period is less than about 30 seconds.

8. The heat treatment process of claim 1, wherein the process comprises admitting an ambient gas into the processing chamber.

9. The heat treatment process of claim 8, wherein the ambient gas comprises nitrogen, argon, or helium.

10. The heat treatment process of claim 8, wherein the ambient gas is at atmospheric pressure.

11. The heat treatment process of claim 8, wherein the ambient gas is at a pressure below about 1 Torr.

12. The heat treatment process of claim 8, wherein the ambient gas comprises one or more of hydrogen, deuterium, ammonia, or hydrazine species.

13. The heat treatment process of claim 1, wherein the process comprises inducing a plasma to create chemically reducing species.

14. The heat treatment process of claim 1, wherein the process comprises creating species using UV light.

* * * * *